United States Patent [19]

Mifflin

[11] 4,005,363
[45] Jan. 25, 1977

[54] RANGE RESOLVING GROUND LINE SENSOR

[75] Inventor: Ralph W. Mifflin, Rome, N.Y.

[73] Assignee: The United States of America as represented by the Secretary of the Air Force, Washington, D.C.

[22] Filed: Oct. 22, 1974

[21] Appl. No.: 516,932

[52] U.S. Cl. .......................... 324/58.5 B; 324/52; 340/258 B
[51] Int. Cl.² .......................................... G01R 27/04
[58] Field of Search ................. 340/1 R, 1 T, 16 R, 340/253 P, 258 B, 258 D; 343/5 PD; 324/58.5 B, 52

[56] References Cited

UNITED STATES PATENTS

| | | | |
|---|---|---|---|
| 3,673,325 | 6/1972 | Uphoff | 340/1 R |
| 3,757,285 | 9/1973 | Ferre | 340/1 R |
| 3,763,482 | 10/1973 | Burney et al. | 179/111 E |
| 3,803,548 | 4/1974 | Skujins, Jr. | 340/15 |
| 3,803,549 | 4/1974 | Holmen et al. | 340/17 |
| 3,831,162 | 8/1974 | Armstrong | 340/16 R |

*Primary Examiner*—Maynard R. Wilbur
*Assistant Examiner*—T. M. Blum
*Attorney, Agent, or Firm*—Joseph E. Rusz; George Fine

[57] ABSTRACT

A range resolving ground line sensor having the capability to determine range along the length of a pressure sensitive type line or cable by providing a time limited pulse of bias voltage which propagates down and back along the line and therefore provides a time history of the impedance changes as a function of distance (time) along the line.

3 Claims, 1 Drawing Figure

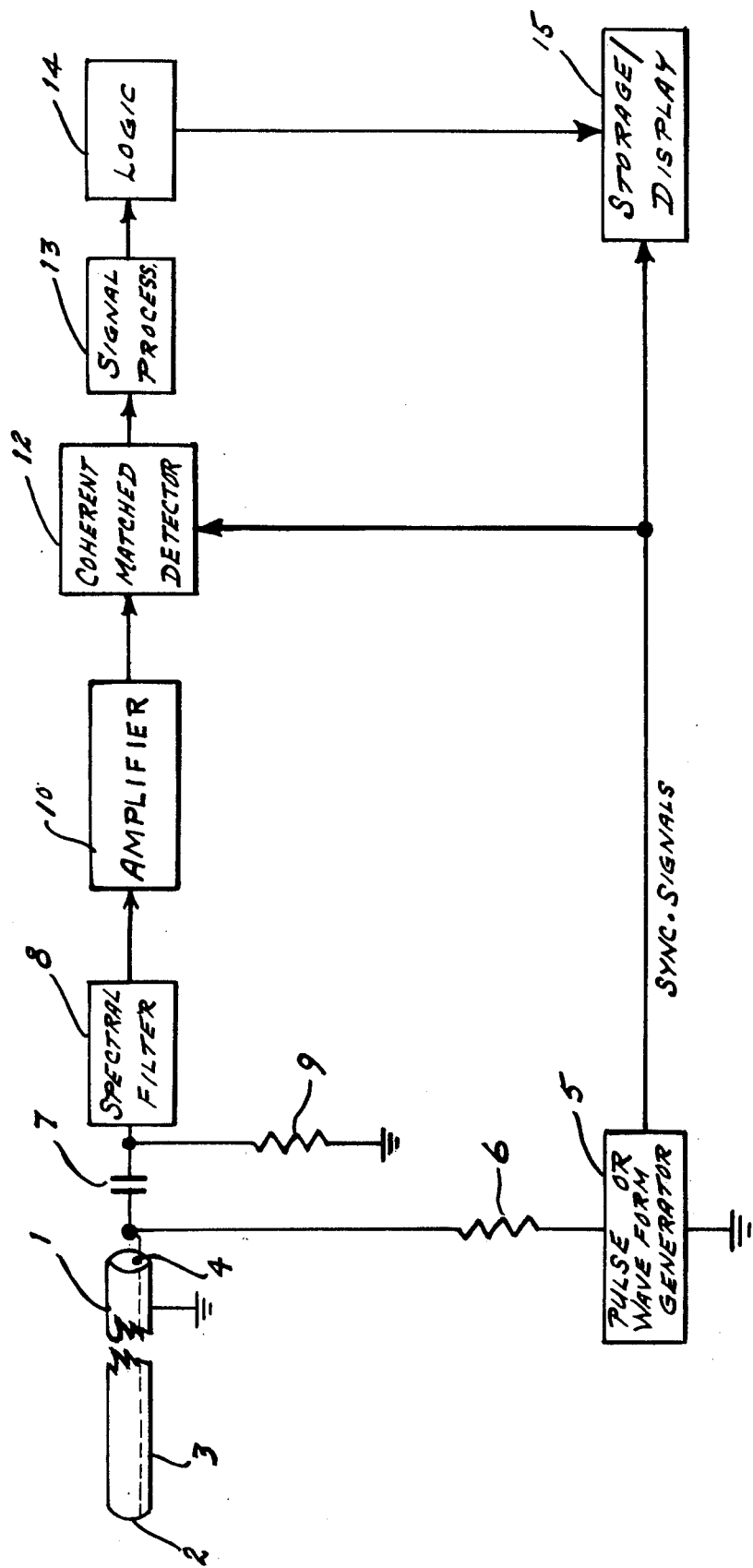

RANGE RESOLVING GROUND LINE SENSOR

BACKGROUND OF THE INVENTION

Typical ground line sensors used to detect pressure changes in the earth, such as acoustic or seismic variations and signals, utilize several different types of transducer phenomena. Some utilize a sensitized or polarized teflon material producing an electret self-generating effect. Others use material giving a piezoelectric effect such as ceramic or quartz, and some a magnetic sensitivity is utilized. A third, and the type which this invention relates to is the impedance effect line. This operates in a similar manner to the electret line except no self-generating mechanism is present. A bias voltage is necessary so that as the capacity or impedance of the line changes (due to small flexures in position and over its length) a total change in capacity inductance or resistance occurs which in turn causes a current flow through a termination resistance. Past and present systems use a constant bias voltage across an offset coaxial line which results in the total line acting as a single capacitor. This causes a loss of any sensitivity in range along the line or where on the line the capacitance change occurred.

Present state-of-the-art ground line sensors that are designed to detect seismic and acoustic signals or disturbances through the earth, have bad limitations in range resolution. They also suffer in sensitivity and usefulness due to the masking effect of the total clutter and background noise picked up by the total length of the line. This limits the length a line can be made useful between detector terminations. This new invention has the unique capability to resolve range along the length of the line or cable to a degree approximately equal to the inverse of the cable's or structure's bandwidth. This also eliminates from the detection problem all clutter not in the same small range cell as the target, thereby allowing a very long line to be used with a single detector terminal, and much improved performance. This is accomplished by using a pulse of bias energy instead of a continuous bias on a line or structure that is designed to be bias dependent for its operation. The range correlated return can then be displayed or range gated for operational readout. This invention is not limited to just basic simple pulse waveforms but could use any time sensitive waveform such as linear frequency modulation, phase coding, pulse compression, spread spectrum, moving target indication (MTI), etc.

This invention will allow much more accurate determination of target range, while at the same time improving the detectability of weak target signals being masked by background clutter and noise.

SUMMARY OF THE INVENTION

A range resolving ground line sensor is provided. The novel features of this invention are its ability to determine the range of a target along a section of line and to eliminate the effects of clutter from parts of the line not in the same range cell as a target. This is accomplished through the unique combination of a bias dependent line type sensor transducer and a pulse or other time sensitive bias or sensitizing waveform with appropriate signal processing and display circuitry.

The essence of this invention is to provide a narrow time limited pulse of bias voltage which propagates down and back along a pressure sensitive-impedance change type line and thereby provide a time history of the impedance changes as a function of distance (time) along the line. This method of applying the bias function provides a "radar" type operation allowing for the application of many types of radar techniques and signal processing systems which have been highly developed and are state-of-the-art today.

DESCRIPTION OF THE DRAWING

There is shown the single FIGURE of the preferred embodiment partly in schematic and partly in block diagram form.

DETAILED DESCRIPTION OF THE PREFERRED EMBODIMENT

Now referring in detail to the single FIGURE, there is shown a capacitive effect type coaxial line (1) which may be incorporated in the ground over a predetermined length. Seismic/acoustic disturbances cause the capacity of the line to change due to small flexures in position and over its length. Coaxial line 1 is open circuited at end 2. Outer conductor 3 can be grounded. Inner conductor 4 is connected to the pulse or waveform voltage generator 5 by way of resistor 6. Inner conductor 4 is also connected to conventional spectral filter 8 by way of DC blocking capacitor 7. Load resistor 9 is connected from the input of spectral filter 8 to ground. The output signal from spectral filter 8 passes through amplifier 10 to the input of conventional coherent matched filter detector 12. Coherent matched filter 12 may simultaneously receive sync signals from generator 5 (if it is an actively gated or correlation type of matched filter). The output signal from coherent matched detector 12 passes through conventional signal processor 13, logic 14, to conventional storage/display 15. Storage/display 15 simultaneously receives sync signals from generator 5 so that each signal can be associated with a given range or point on the line sensor.

In the operation of the sensor, voltage generator 5 provides a short, time limited narrow pulse of bias voltage which propagates down and back along capacitive type coaxial line 1 which will provide a time history of the capacitance changes as a function of distance (time) along the line. The resulting return signal will be amplitude and phase modulated and stretched as a function of time (hence distance) and impedance along the line.

The output signal from coaxial line 1, in response to pressure and flexure, is processed by spectral filter 8 to greatly improve the signal-to-noise ratio for targets and signatures of interest. The improved signal is amplified and then passed through conventional coherent matched detector 12 which may be of the synchronous type or passive type which responds to the signal waveform from generator 5. The detected signals are passed through signal processor 13 which may utilize a conventional MTI (moving target indication) radar processor, and/or signature sorting circuits. Other radar signal processors and decision logic may be used depending upon the desired radar type results. Logic circuit 14 may be of a conventional logic for targets of interest; for example, a time logic wherein continuous type signals for two-second duration or over will result in a signal output to storage/display 15 and anything under a two-second duration will not provide an output therefrom.

Upon receipt of input signal, storage/display 15 will operate to display that signal. The display may be an oscilloscope type with the initiation of the sweep provided by sync signals from generator 5. Thus signals provided by coaxial line 1 are displayed on the face of storage/display 15 and the signal will then provide range information relating to the pressure or flexure applied along coaxial line 1.

It is noted that signal processor 13 and logic 14 may be eliminated and the basic "radar" type ranging operation may still be provided.

This unique method of applying the bias function will thereby provide a "radar" type of operation allowing all the sophisticated signal processing high resolution, range gating, moving target discrimination, target tracking, anti-clutter, pattern recognition, area correlation, multi-dimensional display and other radar techniques which have been highly developed and are state-of-the-art today. It will be obvious to those knowledgeable in the state-of-the-art that other time sensitive waveforms could be used rather than a simple pulse. Linear frequency modulation, pulse compression, pseudo-random phase coding, frequency hopping, frequency multiplexing, pulse code modulation, to name a few which have special desirable properties for specific applications, and this invention covers the use of these as bias signals for a bias sensitive line ground sensor system or technique. Similarly, the capacitive type bias sensitive line is only one of many possible bias sensitive lines. Other examples are lines whose resistance, inductance, or impedance change as a function of pressure of flexure. This invention then covers all combinations of time sensitive (or time resolving) waveforms as a form of bias voltage for use in conjunction with line type ground sensors that require a bias voltage or current for all or part of their operation to occur.

What is claimed is:

1. A range resolving ground sensor system to detect pressure, seismic, and acoustic changes in the earth, water and air and the range for each change of pressure, comprising a pressure sensitive-impedance change type line of a predetermined length incorporated in the earth, said line having first and second conductors, means to generate a predetermined time resolving waveform of bias voltage said time resolving waveform being of the time limited pulse type, said time resolving waveform being received by said first and second conductors for propagation down and back along said first and second conductors to provide a time history of the impedance changes as a function of distance along said first and second conductors, a detector receiving an amplitude and phase modulated signal output from said line representative of a pressure or disturbance change of said earth, said detector simultaneously receiving said predetermined time resolving waveform for synchronous purposes, means for displaying a visual sweep, said display means receiving a synchronizing signal from said means to generate said predetermined time resolving waveform for initiation of said visual sweep, said display means also receiving the detected signal to also be displayed on said visual sweep, the position upon said sweep of said detected signal being a measure of the range of the change of pressure or a disturbance along said line.

2. A range resolving ground sensor as defined in claim 1 further including a spectral filter interposed between said coaxial line and said detector to improve the signal-to-noise ratio of the signals passing therethrough.

3. A range resolving ground sensor as defined in claim 2 further including an MTI signal processor, in series arrangement with a logic circuit, said series arrangement being connected between said detector and said display means.

* * * * *